United States Patent
Murakami

(10) Patent No.: US 6,348,261 B1
(45) Date of Patent: Feb. 19, 2002

(54) SILICON WAFER

(75) Inventor: Yoshio Murakami, Tokyo (JP)

(73) Assignee: Mitsubishi Materials Silicon Corporation, Tokyo (JP)

(*) Notice: Subject to any disclaimer, the term of this patent is extended or adjusted under 35 U.S.C. 154(b) by 0 days.

(21) Appl. No.: 09/668,851

(22) Filed: Sep. 25, 2000

(51) Int. Cl.[7] .............................................. B32B 5/16
(52) U.S. Cl. ...................... 428/332; 428/469; 428/689; 148/33
(58) Field of Search ................................ 428/332, 469, 428/548, 615, 620, 632, 641, 689; 148/33

(56) References Cited

U.S. PATENT DOCUMENTS

| | | | | | |
|---|---|---|---|---|---|
| 4,505,759 A | * | 3/1985 | O'Mara | .................. | 148/1.5 |
| 4,548,654 A | * | 10/1985 | Tobin | .................. | 148/1.5 |
| 5,968,264 A | * | 10/1999 | Iida et al. | .................. | 117/30 |
| 6,077,343 A | * | 6/2000 | Iida et al. | .................. | 117/2 |
| 6,190,631 B1 | * | 2/2001 | Falster et al. | .................. | 423/348 |

* cited by examiner

Primary Examiner—Deborah Jones
Assistant Examiner—Gwendolyn Blackwell-Rudasill
(74) Attorney, Agent, or Firm—Reed Smith LLP

(57) ABSTRACT

The present invention provides a silicon wafer free of vacancy agglomerates and interstitial agglomerate; wherein the silicon wafer has a defect density of an oxide film of 0.1 piece/cm$^2$ or less, when the oxide film having a thickness of 5 to 25 nm is formed on the surface of the wafer and a DC voltage of 10 MV/cm is applied via the oxide film for 100 seconds, and wherein the silicon wafer has an in-plane dispersion of 20% or less of a p-n junction leakage current in a p-n junction area of 1 mm$^2$ or more of a p-n junction portion when the p-n junction portion is formed on the surface of the wafer. The present silicon wafer is capable of achieving a higher performance, higher yield and uniformity of characteristics of semiconductor devices comparable to a wafer provided with a pure epitaxial layer, without deteriorating the gettering ability of the silicon wafer.

2 Claims, 7 Drawing Sheets

(a)

Example 1

(b)

Comparative
Example 1

(a) Example 1

(b) Comparative Example 1

■ ≧10pA
▨ ≧6pA
⊠ ≧5pA
☐ ≧4pA
◪ ≧2pA

US 6,348,261 B1

SILICON WAFER

BACKGROUND OF THE INVENTION

1. Field of the Invention

The present invention relates to a silicon wafer grown by a Czochralski method (hereinafter called "CZ method"), and more particularly to a silicon wafer to be used for: a memory device such as a DRAM (Dynamic Random Access Memory) as an LSI device, a flash memory, an FRAM (Feroelectric Random Access Memory): a CCD (Charge Coupled Device); and a variety of logic devices, mainly microprocessors.

2. Description of the Related Art

Generally, to fabricate various silicon devices, there has been widely used a CZ silicon wafer which is manufactured by pulling up a silicon single crystal ingot from a silicon melt within a quartz crucible by a CZ method.

In such a CZ wafer, excessive oxygen atoms eluted from the quartz crucible are interstitially caught in the silicon single crystal ingot, and the higher concentration of such interstitial oxygen atoms leads to, for example, oxygen precipitation from the silicon wafer, deterioration of a gate oxide film in a semiconductor integrated circuit, and an increase of a p-n junction leakage current. As such, upon forming semiconductor integrated circuits on the principal plane of the CZ wafer, there are reduced oxygen precipitations near the surface of the wafer by lowering the oxygen concentration of the silicon wafer.

However, it is known that, in a CZ wafer, void defects (D defects) are caused within the crystal due to aggregation of atomic vacancies, and the exposure of such defects at the surface of the wafer results in an occurrence of pits called "COP (Crystal Originated Particle)". Such a COP is an etch pit having a deep bottom caused by crystals counted as particles by a laser particle counter after cleaning by an SC-1 liquid during an RCA cleaning method. Formation of an oxide film in a wafer surface including such COP's causes deterioration of electric characteristics such as a time dependent dielectric breakdown (TDDB) characteristic, a time zero dielectric breakdown (TZDB) characteristic, and a gate oxide integrity (hereinafter called "GOI") characteristic; even the concentration of the oxygen precipitations near the wafer surface is low. Further, the existence of COP's in the wafer surface generates a level difference in a wiring process of devices, and this level difference causes breaking of a wire to thereby reduce the yield of products. Moreover, it is known that the existence of COP's causes isolation failure of devices due to the surface-pit caused defects of separated oxide films.

To improve the above points, there is known an epitaxial wafer obtained by forming an epitaxial layer on the surface of a CZ wafer. Such an epitaxial layer catches no oxygen atoms during its growing process, differently from a CZ wafer. Further, in epitaxial wafers, grown-in defects are less which otherwise abundantly exist in CZ wafers, and COP's are covered by an epitaxial layer so that pits like COP's can be expelled from an epitaxial layer surface. Further, a gate oxide film to be obtained by thermally oxidizing a surface of an epitaxial layer is more reliable than that to be obtained by thermally oxidizing a surface of an CZ wafer, thereby enabling improvement of the GOI characteristic.

However, it is becoming apparent that, although the epitaxial layer itself formed on a CZ wafer has lesser grown-in defects and oxygen precipitations, for example, the epitaxial layer may include stacking faults inherent thereto and projections called "mound", thereby deteriorating the device characteristics more severely than by COP's. On the other hand, upon forming an epitaxial layer on a Cz wafer, it is required to conduct a hydrogen annealing treatment at temperatures from 950° C. to 1,100° C. for several tens of minutes, so as to remove a native oxide at the surface of the CZ wafer in advance. However, this treatment causes dissolution and disappearance of grown-in defects within the CZ wafer to thereby also restrict oxygen precipitation, defectively or problematically resulting in deterioration of a gettering ability of the CZ wafer itself.

Meanwhile, when no epitaxial layers are formed, the aforementioned void defects within a CZ wafer are characteristically found within a ring-like generation domain of "oxidation induced stacking faults (hereinafter called "OSF")" to be usually found depending on the pulling-up conditions of crystals. As such, crystals including diameter-reduced OSF rings have been recently turned out to be used widely, so as to reduce the ratio of a generation domain of void defects to the whole of a wafer. By adopting such a method, there has been also proposed a low-speed pulled-up crystal which is free of void defects by extremely reducing the pulling-up speed.

However, detailed research of a GOI characteristic and a p-n junction leakage current characteristic of a wafer having a diameter-reduced OSF ring has revealed that the GOI characteristic is considerably deteriorated not only inside an OSF ring but also on the OSF ring, and that the p-n junction leakage current characteristic is also considerably deteriorated on the OSF ring and does not exhibit uniform values at the inside and outside of the OSF ring. Further, it has become apparent that void defects are expelled in a low-speed pulled-up crystal, but dislocation loops are generated in such a crystal, to thereby considerably deteriorate the p-n junction leakage current.

SUMMARY OF THE INVENTION

It is therefore an object of the present invention to provide a silicon wafer capable of achieving a higher performance, higher yield and uniformity of characteristics of semiconductor devices comparable to a wafer provided with a pure epitaxial layer, without deteriorating the gettering ability of the silicon wafer.

To this end, in the first aspect of the present invention, a silicon wafer is free of vacancy agglomerates and interstitial agglomerates, wherein the silicon wafer has a defect density of an oxide film of 0.1 piece/$cm^2$ or less, when the oxide film having a thickness of 5 to 25 nm is formed on the surface of the wafer and a DC voltage of 10 MV/cm is applied via the oxide film for 100 seconds, and wherein the silicon wafer has an in-plane dispersion of 20% or less of a p-n junction leakage current in a p-n junction area of 1 $mm^2$ or more of a p-n junction portion when the p-n junction portions are formed on the surface of the wafer.

Further, in the second aspect of the present invention, a silicon wafer is free of vacancy agglomerates and interstitial agglomerates, wherein the silicon wafer has a defect density of an oxide film of 0.1 piece/$cm^2$ or less, when the oxide film having a thickness of 5 to 25 nm is formed on the surface of the wafer and a DC voltage of 10 MV/cm is applied via the oxide film for 100 seconds, and wherein the silicon wafer has in-plane dispersions of 20% or less of both of: a recombination lifetime by a photo conductive decay method; and a generation lifetime measured by a MOS C-t method by forming a MOS capacitor.

In this concern, the basic characteristics of a crystal factor for determining a characteristic of a silicon device is the GOI characteristic and the p-n junction leakage current characteristic. These characteristics can not be satisfied such as when the defect density of an oxide film exceeds 0.1 piece/cm², or when the in-plane dispersion of a p-n junction leakage current in a junction is area greater than 1 mm² at the p-n junction portion or the in-plane dispersions of both of a recombination lifetime and a generation lifetime exceeds or exceed 20%. The defect density of an oxide film is preferably 0.06 piece/cm² or less, and the in-plane dispersion of a p-n junction leakage current in a junction area greater than 1 mm² at the p-n junction portion or the in-plane dispersions of both of a recombination lifetime and a generation lifetime is/are preferably 10% or less.

The present silicon wafers according to the first and second aspects satisfy these characteristics, to thereby guarantee characteristics of various semiconductor devices with higher reliability. Further, the absence of an epitaxial layer leads to the retention of the gettering ability.

DETAILED DESCRIPTION OF THE PREFERRED EMBODIMENT

There will be firstly explained vacancy agglomerates and interstitial agglomerates. When a single crystal silicon ingot is pulled up from a silicon melt within a hot zone furnace by a CZ method, the defects in the single crystal of silicon generally includes point defects and agglomerates (three-dimensional defects). Point defects are classified into two general types, i.e., a vacancy point defect and an interstitial silicon point defect. The vacancy point defect is a type where one silicon atom is omitted from a normal position in a silicon crystal lattice. Such a vacancy leads to a vacancy point defect. Meanwhile, the presence of a silicon atom at a non-lattice point (interstitial site) leads to an interstitial silicon point defect.

Further, point defects are generally formed at an interface between a silicon melt (melted silicon) and an ingot (solid silicon). However, as the ingot is pulled up, the portion having been the interface starts to be cooled. During the cooling, vacancy point defects or interstitial silicon point defects are mutually merged to thereby form vacancy agglomerates or interstitial agglomerates, respectively. In other words, agglomerates are three-dimensional structures generated by mergence of point defects.

Vacancy agglomerates include defects called "LSTD (Laser Scattering Tomograph Defects)" or "FPD (Flow Pattern Defects)" in addition to the aforementioned COP, while interstitial agglomerates include defects called "L/D (Large/Dislocation) agglomerates" or "dislocation agglomerates". LSTD are sources which have refractive indexes different from that of silicon and which generate scattered light upon radiation of infrared rays into a single crystal of silicon. Further, FPD are sources of traces which exhibit a unique flow pattern which appears on a silicon wafer fabricated by slicing an ingot when the silicon wafer is chemically etched by a Secco etchant for 30 minutes.

The silicon wafer of the present invention is fabricated by pulling up an ingot from a silicon melt within a hot zone furnace by a CZ method, at a predetermined pulling-up speed profile based on a Voronkov's theory, and by slicing the ingot. The predetermined pulling-up speed profile of the ingot is rendered to be a high degree sufficient to be able to avoid interstitial agglomerates and to be a low degree sufficient to be able to avoid vacancy agglomerates. Those silicon wafers fabricated by slicing such an ingot become pure silicon wafers which include point defects but which are free of vacancy agglomerates and interstitial agglomerates.

Figure 1:
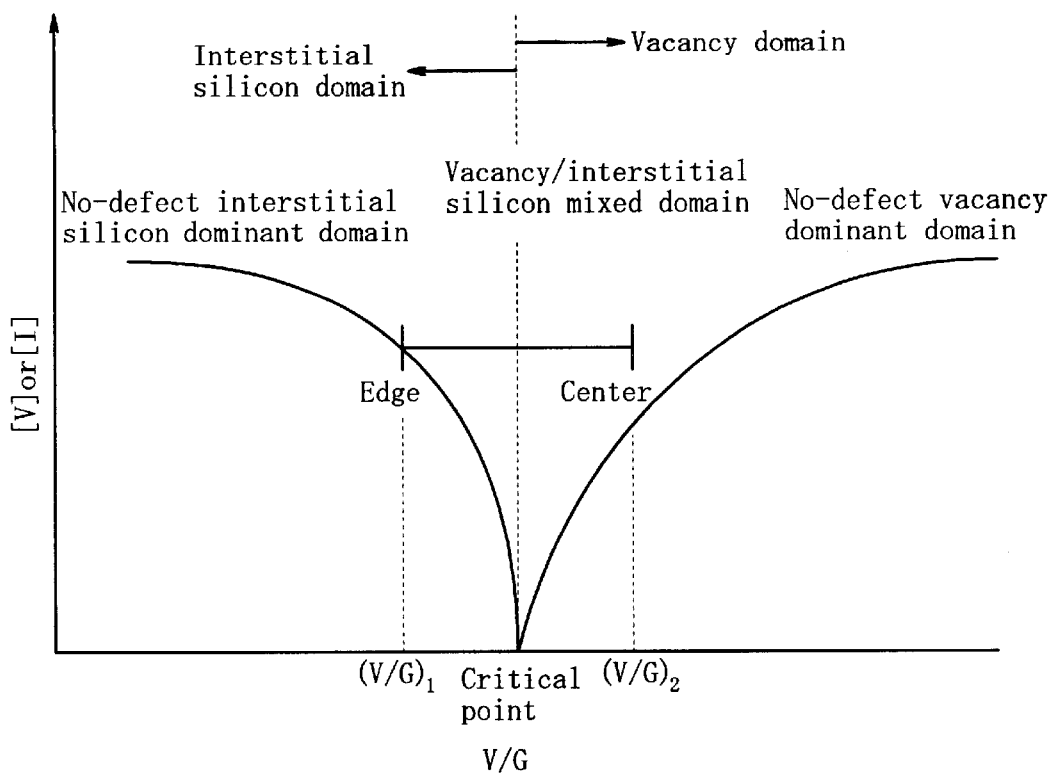
FIG. 1 shows a fact that a vacancy-dominant ingot is formed at a V/G ratio of the critical point or higher and an interstitial silicon dominant ingot is formed at a V/G ratio of the critical point or lower, based on the Voronkov's theory in an embodiment of the present invention.

The aforementioned Voronkov's theory is to control a V/G ratio so as to grow a high purity ingot having fewer defects, where V is a pulling-up speed of an ingot and G is a temperature gradient at an interface between an ingot and silicon melt in a hot zone structure. As shown in FIG. 1, this theory represents diagrammatically a vacancy density and an interstitial silicon density as a function of the V/G ratio, and explains that the occurrence of vacancy/interstitial mixture in a wafer is determined by the V/G ratio. More specifically, a vacancy dominant ingot is formed when the V/G ratio is greater than a critical point, while an interstitial silicon dominant ingot is formed when the V/G ratio is smaller than the critical point.

The predetermined pulling-up speed profile for obtaining a silicon wafer according to the present invention is determined such that the ratio (V/G) of a pulling-up speed to a temperature gradient is greater than a first critical ratio ((V/G)₁) for avoiding interstitial agglomerates and smaller than a second critical ratio ((V/G)₂) for restricting vacancy agglomerates to a vacancy dominant domain at the center of an ingot, when the ingot is pulled up from a silicon melt within a hot zone furnace.

Figure 2:
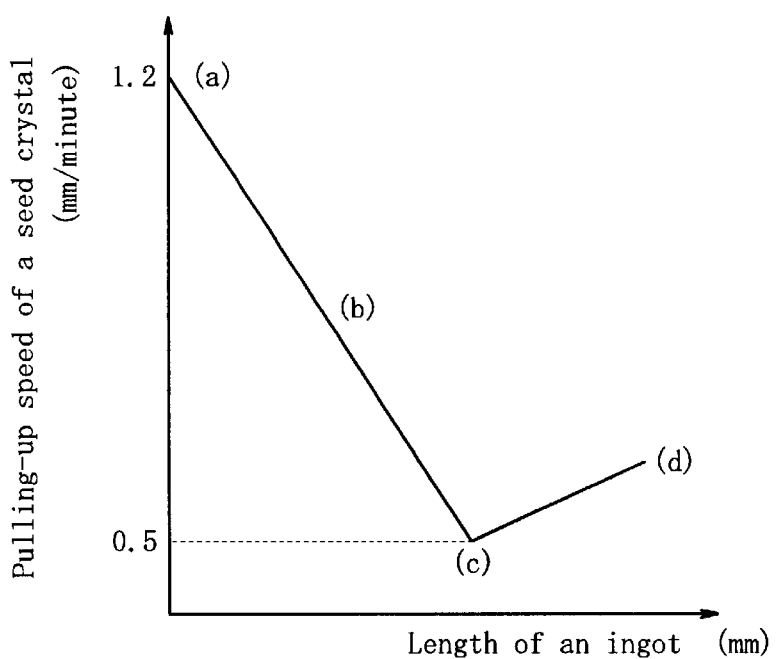
FIG. 2 is a characteristic diagram showing variation of a pulling-up speed for determining a desired pulling-up speed profile.

This pulling-up speed profile is determined by a simulation based on the Voronkov's theory, such as by empirically slicing a reference ingot in an axial direction, by empirically slicing a reference ingot into wafers, or by combining these techniques. Namely, this determination is performed by confirming the axial slice and sliced wafers after the simulation, and then repeating the simulation. There are determined a plurality of kinds of pulling-up speeds in a predetermined range, and a plurality of reference ingots are grown. As shown in FIG. 2, the pulling-up speed profile for the simulation is adjusted to a higher pulling-up speed such as 1.2 mm/min (a), a lower pulling-up speed such as 0.5 mm/min (c), and again to a high pulling-up speed of 0.5 mm/min (d). The aforementioned lower pulling-up speed may be 0.4 mm/min or less, and the pulling-up speeds (b) and (d) are preferably made to be linear.

Multiple reference ingots pulled up at different speeds are individually sliced in axial directions, respectively. There is determined an optimum V/G ratio based on a correlation between the axial slices, confirmation of wafers, and the result of the simulation, then an optimum pulling-up speed profile is determined, and ingots are manufactured based on such a profile. The actual pulling-up speed profile depends on various parameters such as including a diameter of a desired ingot, a specific hot zone furnace to be used, and a quality of a silicon melt, without limiting thereto.

Figure 3:
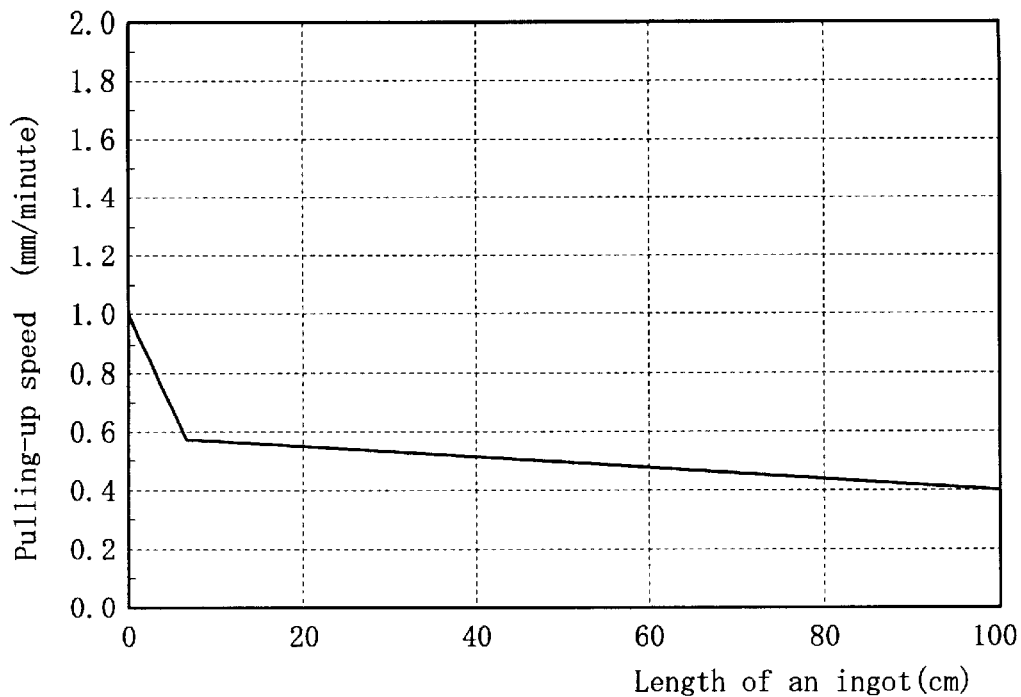
FIG. 3 is a characteristic diagram graphically showing a pulling-up speed profile for growing a vacancy dominant wafer and a perfect wafer according to the present invention.

FIG. 3 shows a pulling-up speed profile for growing an ingot having a length of 100 cm and a diameter of 200 mm determined by utilizing the combination of the simulation and the empirical technique. There has been used herein a hot zone furnace having a model name of Q41 fabricated by the IKUNO factory of Mitsubishi Material Silicon Co., Ltd., based on the CZ method.

Figure 4:
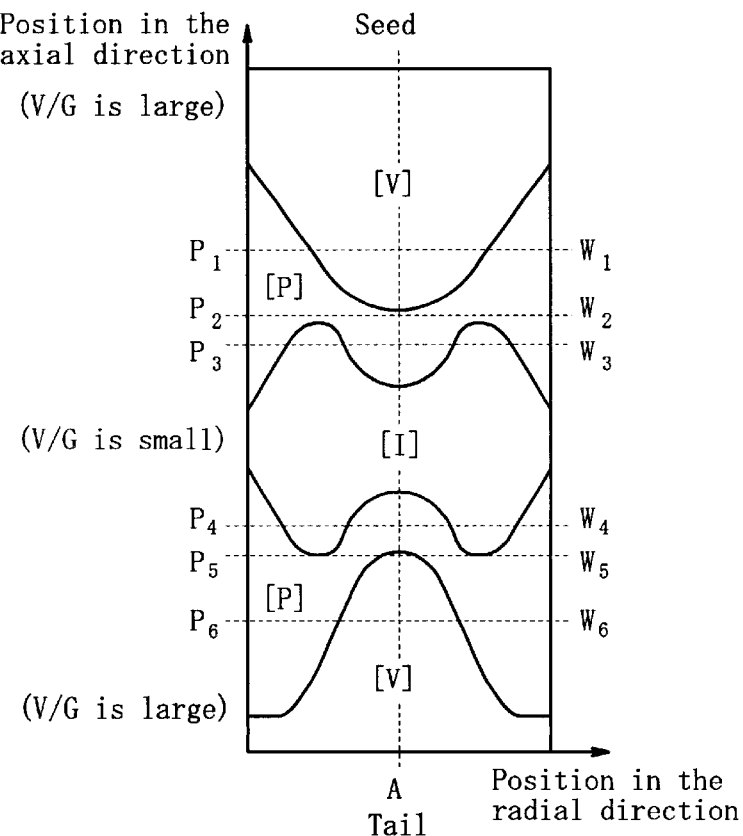
FIG. 4 is a schematic view based on X-ray tomography, showing a vacancy dominant domain, an interstitial silicon dominant domain and a perfect domain of a reference ingot according to the present invention.

FIG. 4 actually shows a cross-sectional view of an ingot obtained by gradually decreasing the pulling-up speed to thereby continuously lower the V/G ratio, and by again increasing the pulling-up speed to thereby increase the V/G ratio. In FIG. 4, the marks [V], [I] and [P] represent a vacancy dominant domain, an interstitial dominant domain and a perfect domain free of vacancy agglomerates and interstitial agglomerates, respectively. As shown in FIG. 4, the axial positions $P_1$ and $P_6$ centrally include vacancy dominant domain, respectively. The positions $P_3$ and $P_4$ include interstitial silicon dominant rings and central perfect domains, respectively. Further, the axial positions $P_2$ and $P_5$ are fully perfect domains, because these positions include neither central vacancy dominant domain nor peripheral interstitial silicon dominant domain.

Figure 5:
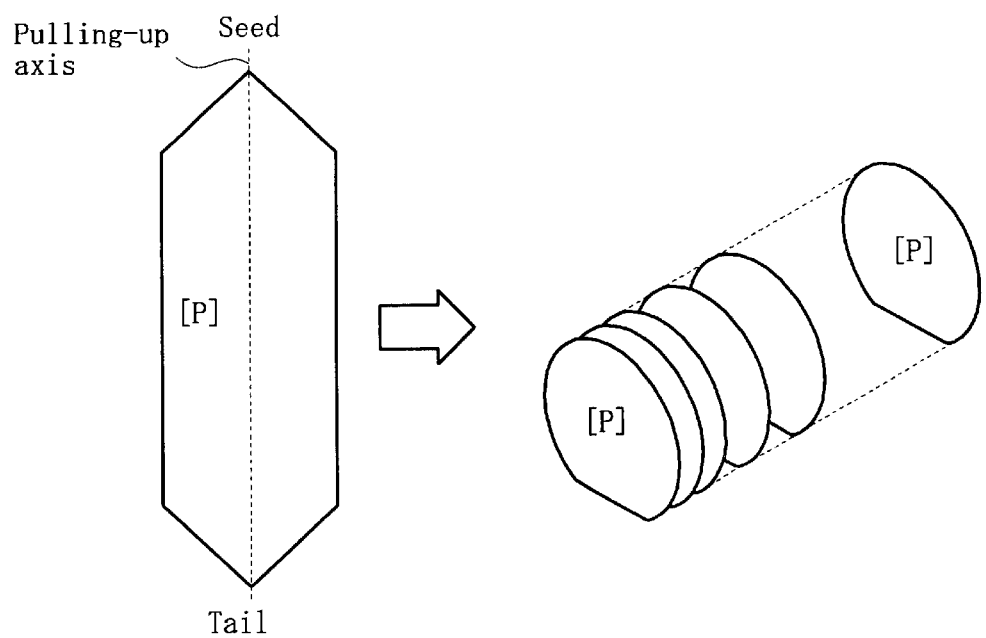
FIG. 5 is an explanatory view of an ingot and wafers according to the present invention, free of vacancy agglomerates and interstitial agglomerates.
Figure 6:
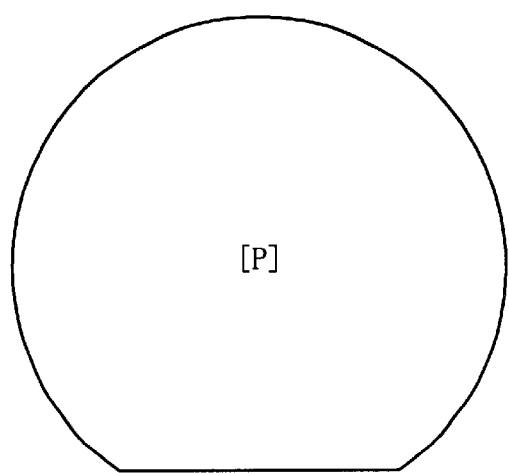
FIG. 6 is a plan view of the wafer of FIG. 5.
Figure 7:
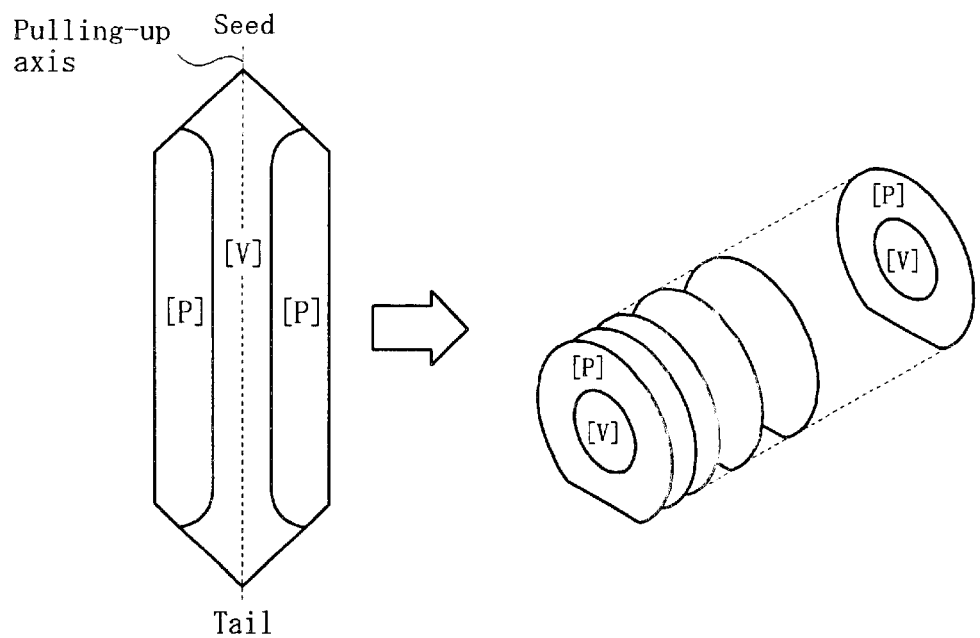
FIG. 7 is an explanatory view of an ingot and wafers, each having a vacancy dominant domain at the center and a defect-free domain between the vacancy dominant domain and a circumferential portion.
Figure 8:
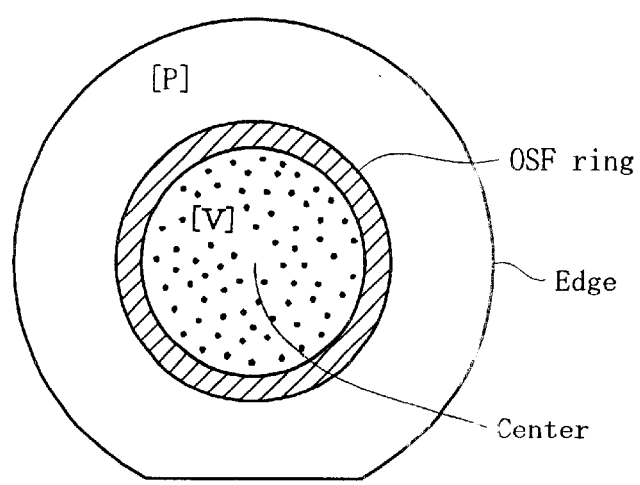
FIG. 8 is a plan view of the wafer of FIG. 7.

As apparent from FIG. 4, wafers $W_1$ and $W_6$ corresponding to the positions $P_1$ and $P_6$ centrally include vacancy dominant domains, respectively. Wafers $W_3$ and $W_4$ include interstitial silicon dominant rings and central perfect domains, respectively. Further, the wafers $W_2$ and $W_5$ are fully perfect domains, because these wafers include neither central vacancy dominant domain nor peripheral interstitial silicon dominant domain. Wafers $W_2$ and $W_5$ are fabricated by slicing an ingot grown at a pulling-up speed profile selectively determined so as to fabricate a fully perfect domain as shown in FIG. 5. FIG. 6 is a plan view of such a wafer. FIG. 7 shows wafers $W_1$ and $W_6$ fabricated by slicing an ingot grown at another pulling-up speed profile, for reference. FIG. 8 is a plan view of such a wafer. As shown in FIG. 8, an OSF ring is formed between a central vacancy dominant domain and a peripheral perfect domain. The silicon wafers of the present invention are the wafers $W_2$ and $W_5$.

Silicon wafers of the present invention fully consisting of perfect domains with further control of an oxygen concentration are obtained by lapping, chamfering and then mirror polishing the wafer.

The measuring procedure of the present invention for measuring a defect density of an oxide film is conducted by firstly RCA cleaning a silicon wafer to thereby remove native oxide, particles and metal impurities of a wafer surface, and then forming oxide films having a thickness of 5 to 25 nm on the wafer surface by a pyrogenic oxidization. The whole of the wafer front surface is then patternedly divided into 50 or more pieces of segments, electrodes comprising polysilicon are formed at respective points on the oxide film of the wafer front surface by a chemical vapor deposition (CVD) method, the oxide film on the back surface is then removed, and a DC voltage of 10 MV/cm is finally applied for 100 seconds between each electrode and the back surface. After the application of the voltage, a voltage is again applied in the same manner, and, based on a quantity of electric current flowing through each electrode, there is checked presence/absence of damage of the oxide film at each point, to thereby calculate a defect density based on the number of damaged points relative to all points.

Figure 9:
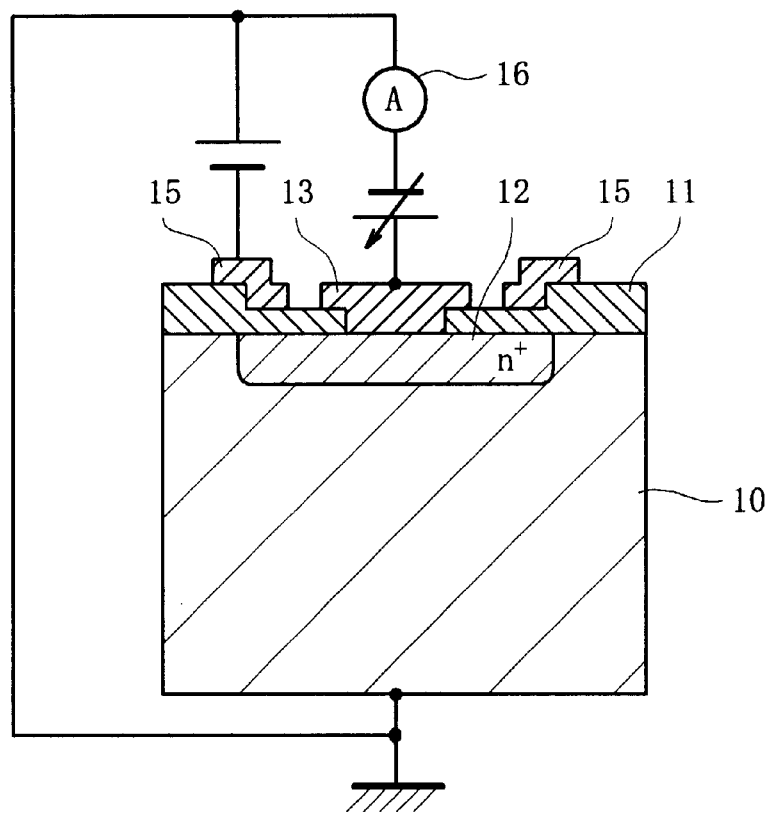
FIG. 9 is a constitutional view for measuring a p-n junction leakage current.

Further, the measuring procedure of the present invention for measuring a p-n junction leakage current is conducted by firstly RCA cleaning a silicon wafer of a p-type, similarly to the above method for measuring a defect density of an oxide film. Next, as shown in FIG. 9, a field oxide film 11 is formed on the front surface of a wafer 10 by wet oxidizing it, and then the oxide film 11 is patterned to form a diffusion window. Next, phosphorus is diffused to thereby form an $n^+$ layer 12, followed by formation of a contact hole in the area of the $n^+$ layer 12. Further, by depositing an Al (1% Si) layer in this area by sputtering, an electrode 13 is formed, and simultaneously therewith a guard ring electrode 15 is formed around the electrode 13, and the oxide film at the back surface is finally removed. Reverse bias ranging from 0 V to 20 V is applied between the $n^+$ layer 12 and the wafer front surface, and simultaneously therewith, a bias voltage of −20 V is applied to the guard ring electrode 15. The electric current to be flown then is measured by an ammeter 16. FIG. 9 shows a single electrode 13, for simplified explanation. Actually, the whole of the wafer front surface is patternedly divided into 50 or more pieces of segments, electrodes are formed at respective points, and a leakage current value is measured at each point. There is obtained an in-plane dispersion of wafer by obtaining leakage current values at all points.

Presently, a p-n junction being used in an actual device is provided by performing an element separation making use of a LOCOS (Local Oxidation of Silicon) structure and a boron implantation. However, it is preferable to conduct the measurement by applying a negative guard-ring bias voltage so as to restrict the surface reversal of the p-type for the purpose of crystal evaluation, since such a bias process is simple and does not use a procedure likely to introduce contamination such as ion implantation.

Further, the measuring procedure of the present invention for measuring a recombination lifetime is to measure recombination of a small number of optically implanted carriers by reflection of a microwave based on a standard photo conductive decay ($\mu$-PCD) method, and to obtain a recombination lifetime from the time constant of the decay. Moreover, the measuring procedure of the present invention for measuring a generation lifetime is to form a MOS capacitor, to apply a voltage to the capacitor, and then to Zerbst analyze the C-t characteristic of the time change.

EXAMPLES

There will be described hereinafter examples of the present invention together with comparative examples.

Example 1

The single crystal silicon wafer (wafer $W_2$ of FIG. 4) shown in FIG. 6 obtained by slicing the ingot shown in FIG.

5 was lapped and chamfered, and then mirror polished, to thereby prepare two sheets of wafers free of vacancy agglomerates and interstitial agglomerates. Each of these single crystal silicon wafers was 8 inch, of a boron doped p-type, of a (100) orientation, and had a lower oxygen concentration less than $1.15 \times 10^{18}/cm^3$ (in terms of old ASTM).

Comparative Example 1

For comparison, the single crystal silicon wafer (wafer $W_1$, of FIG. 4) shown in FIG. 8 obtained by slicing the ingot shown in FIG. 7 was lapped and chamfered, and then mirror polished, to thereby prepare two sheets of wafers each having an OSF ring, a central vacancy dominant domain, and a peripheral perfect domain. Similarly to the example 1, each of these single crystal silicon wafers was 8 inch, of a boron doped p-type, of a (100) orientation, and had a lower oxygen concentration less than $1.15 \times 10^{18}/cm^3$.

Comparison Test and Evaluation (a) Formation of Oxide Film and Electrode

Firstly, ones of the single crystal silicon wafers of example 1 and comparative example 1 were cleaned by an SC-1 cleaning liquid ($NH_4OH:H_2O_2:H_2O=1:1:5$), and then cleaned by an SC-2 cleaning liquid ($HCl:H_2O_2:H_2O=1:1:5$). Next, an oxide film was formed on the front surface of each of these wafers, under the following standard condition. Namely, each cleaned single crystal silicon wafer was pyrogenically oxidized at 900° C. to thereby form an oxide film having a thickness of 9 nm on the wafer front surface. Furthermore, an electrode was formed on the oxide film, under the following standard condition. Namely, silane ($SiH_4$) was thermally decomposed at 640° C. for 72 minutes by a CVD method, to thereby grow a polysilicon film having a thickness of approximately 500 nm on the oxide film. After depositing phosphorus oxychloride on the polysilicon film, it was thermally diffused at 1,000° C. for 60 minutes under a wet oxygen atmosphere. Thereafter, an electrode pattern having an area of 20 $mm^2$ was formed by a photolithography process.

(b) Measurement of Oxide Film Defect Density

Voltage stress of 10 Mv/cm was firstly applied to the oxide film, and then the same voltage is again applied and the damaged number of MOS capacitors was checked. Oxide film damages were regarded as dielectric breakdown, when the electric current density reached 100 $\mu A/cm^2$. This measurement was performed at 181 points over the whole surface of the wafer. FIG. 10(a) shows an in-plane distribution of oxide film defects of example 1 while FIG. 10(b) shows an in-plane distribution of oxide film defects of comparative example 1. Those fully painted black portions express dielectric breakdown portions.

(c) Formation of p-n Junction Portion

Firstly, the remaining ones of the aforementioned single crystal silicon wafers were cleaned by an SC-1 cleaning liquid ($NH_4OH:H_2O_2:H_2O=1:1:5$), and then cleaned by an SC-2 cleaning liquid ($HCl:H_2O_2:H_2O=1:1:5$). Next, a field oxide film having a thickness of 600 nm was formed on the front surface of each of these wafers, by wet oxidizing the wafers at 1,100° C. for 110 minutes. Thereafter, this oxide film was patterned by a photolithography technique to thereby form a diffusion window, and an $n^+$ layer was formed there by solid phase diffusion making use of phosphorus oxychloride ($POCl_3$). The phosphorus diffusion condition here was such that a PSG (phosphorus silicate glass) was removed by etching at 900° C. for 20 minutes, and then phosphorus was thermally diffused under a condition of 1,000° C. for 60 minutes. The diffusion depth of the $n^+$ layer was about 2 $\mu$m, and its concentration was $1 \times 10^{19}/cm^3$. After making a contact hole, Al including 1.5% Si was deposited there by sputtering. After electrode patterning, an annealing treatment was conducted at 450° C. within an $N_2$ atmosphere, and an oxide film on the back surface was finally removed. The junction area was provided by selecting a 1.8 mm×1.8 mm form pattern.

(d) Measurement of Uniformity of p-n Junction Leakage Current

A voltage was applied to a p-n junction portion of each wafer, and the leakage current of the junction was measured by an HP4140 (pA) meter. At this time, it was devised to restrict a surface reversal of a p-type, by applying a bias to the guard-ring by an HP4141B (current-voltage source). As a negative guard-ring bias, −20 V was used. This measurement was performed at 272 points over the whole surface of the wafer. FIG. 11(a) shows an in-plane distribution of a p-n junction leakage current of example 1 while FIG. 11(b) shows an in-plane distribution of a p-n junction leakage current of comparative example 1.

(e) Evaluation

Figure 10:
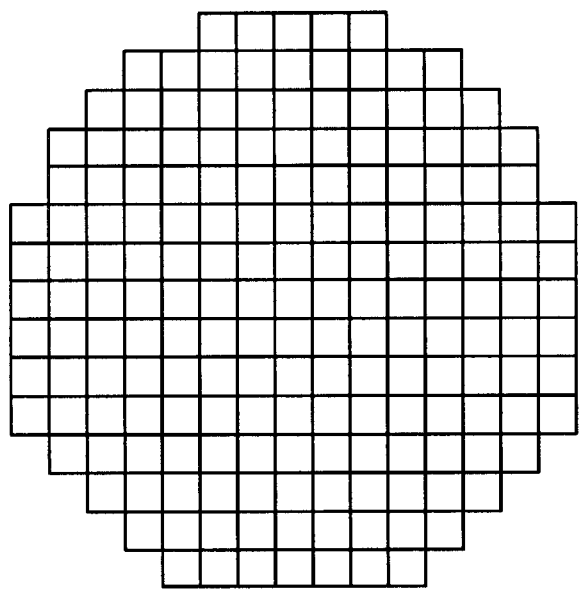
FIG. 10(a) is a view showing an in-plane distribution of oxide film defects of a first example of the present invention.
FIG. 10(b) is a view showing an in-plane distribution of oxide film defects of a comparative example 1.
Figure 10:
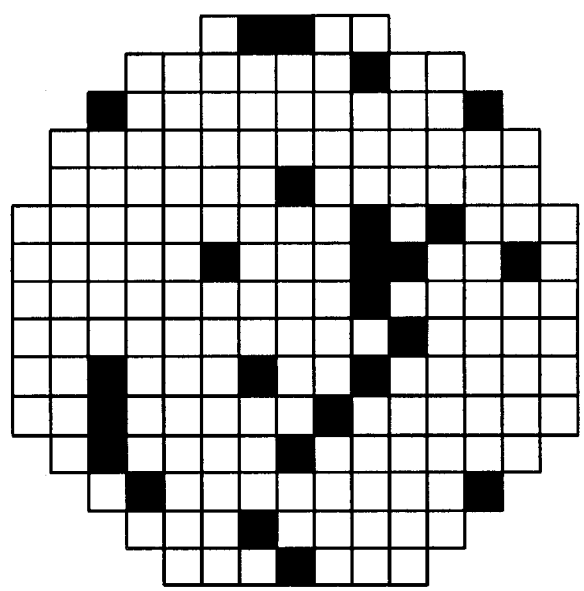

As apparent from FIG. 10, no oxide film defects were found in the wafer of example 1, whereas oxide film defects were found inside the OSF ring (at 25 points among 181 points) in the in-plane distribution of a time zero dielectric breakdown characteristic of the wafer of comparative example 1.

Figure 11:
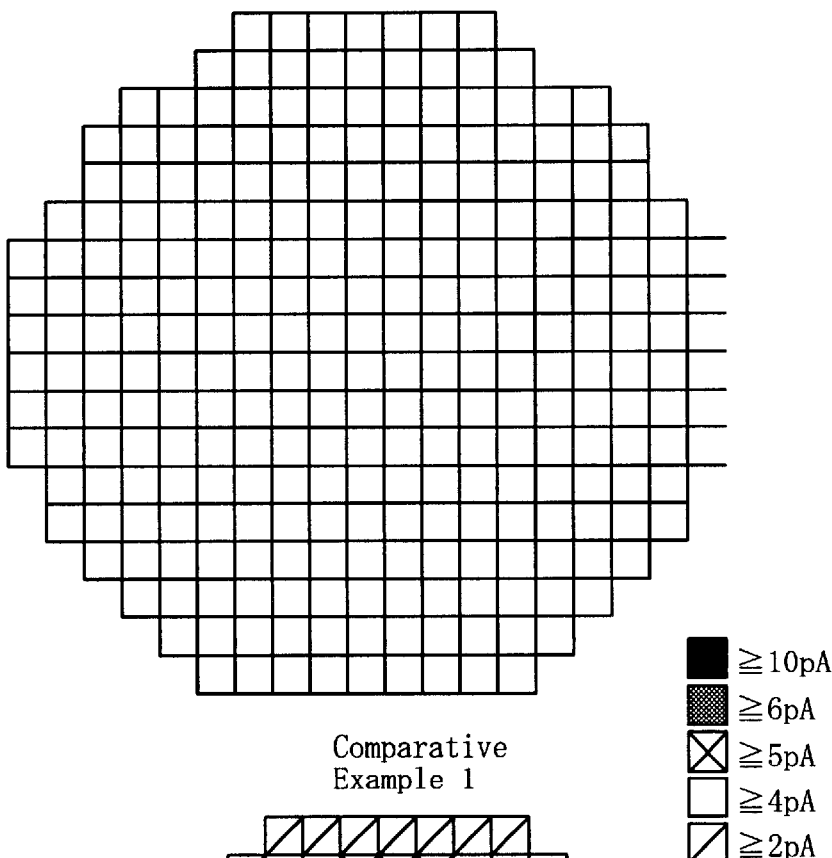
FIG. 11(a) is a view showing an in-plane distribution of a p-n junction leakage current of the first example.
FIG. 11(b) is a view showing an in-plane distribution of a p-n junction leakage current of the comparative example 1.
Figure 11:
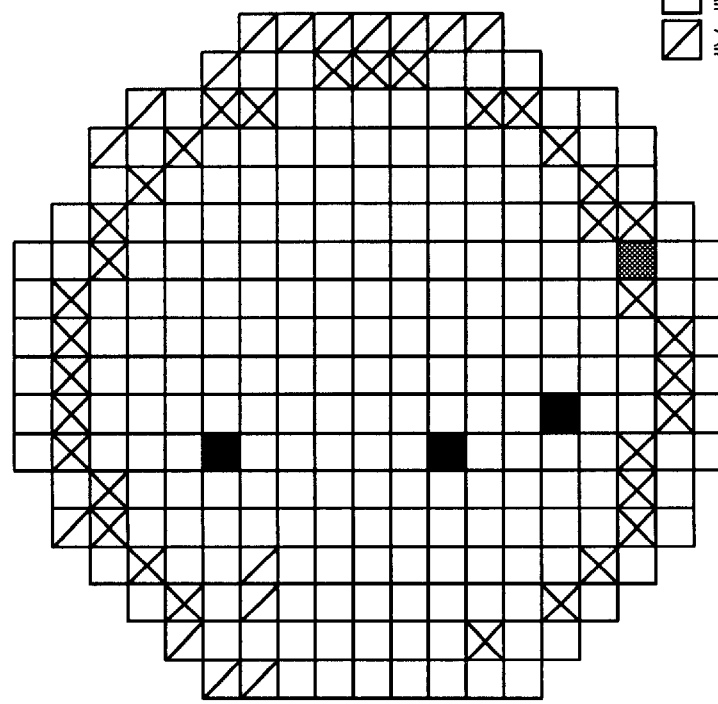

Further, as apparent from FIG. 11, concerning the measurement of a p-n junction leakage current, the leakage current was higher on the OSF ring of the wafer of comparative example 1, i.e., this wafer had 3 points (black portion in the figure) of leakage current of 10 pA or more, 1 point (gray portion in the figure) of leakage current of 6 to 7 pA, 34 points ("X" portion in the figure) of leakage current of 5 to 6 pA, 218 points (blank portion in the figure) of leakage current of 4 to 5 pA, and 16 points ("/" portion in the figure) of leakage current of 2 to 3 pA, among 272 points. As a result, there was found an in-plane dispersion on the order of 50%. Contrary, all points (blank portions in the figure) of the leakage currents in the wafer of example 1 were 4 to 5 pA, and the in-plane dispersion was on the order of only 3%, thereby providing an excellent in-plane distribution.

As described above, there can be guaranteed the integrity of the GOI characteristic and the uniformity of p-n junction leakage current of the wafer according to the present invention. Thus, in DRAM's, it becomes possible to reduce defects concerning reliability of oxide films and defects concerning refresh disorders. Further, in imaging devices such as CCD, it becomes possible to overcome problems such as clear defect. As a result, the silicon wafer of the present invention can achieve a higher performance, higher yield and uniformity of characteristics of semiconductor devices comparable to a wafer provided with a pure epitaxial layer. Further, there can be realized a superior effect that the gettering ability of the silicon wafer is not deteriorated differently from a wafer having an epitaxial layer.

What is claimed is:

1. A silicon wafer free of vacancy agglomerates and interstitial agglomerates, wherein said silicon wafer has a defect density of an oxide film of 0.1 piece/$cm^2$ or less, when the oxide film having a thickness of 5 to 25 nm is formed on the surface of the wafer and a DC voltage of 10 MV/cm is applied via the oxide film for 100 seconds, and wherein said silicon wafer has an in-plane dispersion of 20% or less of a p-n junction leakage current in a p-n junction area of 1 mm$^2$ or more of a p-n junction portion when said p-n junction portion is formed on the surface of said wafer.

2. A silicon wafer free of vacancy agglomerates and interstitial agglomerates, wherein said silicon wafer has a defect density of an oxide film of 0.1 piece/cm$^2$ or less, when the oxide film having a thickness of 5 to 25 nm is formed on the surface of the wafer and a DC voltage of 10 MV/cm is applied via the oxide film for 100 seconds, and wherein said silicon wafer has in-plane dispersions of 20% or less of both of: a recombination lifetime by a photo conductive decay method; and a generation lifetime measured by a MOS C-t method by forming a MOS capacitor.

* * * * *